United States Patent
Krause et al.

(10) Patent No.: US 6,630,825 B2
(45) Date of Patent: Oct. 7, 2003

(54) ELECTROMECHANICAL DRIVE FOR MAGNETOMETERS

(75) Inventors: John Krause, Westerville, OH (US); Jefferey Lindemuth, Galena, OH (US); Edward Maloof, Blacklick, OH (US); David Plaga, Columbus, OH (US)

(73) Assignee: Lake Shore Cryotronics, Inc., Westerville, OH (US)

( * ) Notice: Subject to any disclaimer, the term of this patent is extended or adjusted under 35 U.S.C. 154(b) by 0 days.

(21) Appl. No.: 10/098,383

(22) Filed: Mar. 18, 2002

(65) Prior Publication Data

US 2003/0038627 A1 Feb. 27, 2003

Related U.S. Application Data

(60) Provisional application No. 60/314,434, filed on Aug. 23, 2001.

(51) Int. Cl.[7] ............................................. G01R 33/12
(52) U.S. Cl. ................... 324/228; 324/239; 324/261
(58) Field of Search ......................... 324/201, 228, 324/236, 239, 244, 259–262

(56) References Cited

U.S. PATENT DOCUMENTS

| | | |
|---|---|---|
| 2,946,948 A | 7/1960 | Foner |
| 3,496,459 A | 2/1970 | Foner |
| 4,005,358 A | 1/1977 | Foner |
| 4,037,149 A | 7/1977 | Foner |
| 4,062,049 A * | 12/1977 | Dirks ....................... 360/78.12 |
| 4,428,055 A | 1/1984 | Zurbrick et al. |
| 4,461,984 A * | 7/1984 | Whitaker et al. ............ 318/687 |
| 4,694,696 A | 9/1987 | Hojo et al. |
| 5,054,313 A | 10/1991 | Fitzgerald et al. |
| 5,402,400 A * | 3/1995 | Hamada et al. ........... 360/78.06 |
| 5,488,950 A * | 2/1996 | Ehnholm .................... 600/410 |
| 5,883,478 A | 3/1999 | Thesling |
| 5,913,955 A | 6/1999 | Redmond et al. |
| 6,145,730 A | 11/2000 | Wiesemann |
| 6,164,134 A | 12/2000 | Cargille |
| 6,173,604 B1 | 1/2001 | Xiang et al. |
| 6,237,399 B1 | 5/2001 | Shivaram et al. |
| 6,407,545 B1 | 6/2002 | Sato et al. |
| 6,499,340 B1 | 12/2002 | Yasutake et al. |

FOREIGN PATENT DOCUMENTS

| | | |
|---|---|---|
| GB | 2 265 013 A | 9/1993 |
| JP | 63241476 | 10/1988 |
| JP | 5172922 | 7/1993 |

OTHER PUBLICATIONS

Data Sheet, "Lake Shore Model 7404 Vibrating Sample Magnetometer," 3 pages (11/01).

Dodrill, B.C. et al., "Measurements with A VSM, Permanent Magnet Materials," (1999).

Dufeu, D. et al., "High sensitivity 2T vibrating sample magnetometer," *Review Of Scientific Instruments*, vol. 70, No. 7, pp. 3035–3039 (Jul./1999).

Krishnan, R. V. et al., "Harmonic detection of multipole moments and absolute calibration in a simple, low–cost vibrating sample magnetometer," *Review Of Scienfific Instruments*, vol. 70, No. 1, pp. 85–91 (Jan./1999).

Samwel, E.O. et al., "An alternative approach to vector vibrating sample magnetometer detection coil setup," *Review Of Scientific Instruments*, vol. 69, No. 9, pp. 3204–3209 (0/1998).

(List continued on next page.)

*Primary Examiner*—N. Le
*Assistant Examiner*—Reena Aurora
(74) *Attorney, Agent, or Firm*—Nixon & Vanderhye P.C.

(57) ABSTRACT

A vibrating sample magnetometer controls an electromechanical drive using both ac and dc control and a position sensor. Absolute position sensing is used in a feedback loop to control both an alternating current (ac) drive and a direct current (dc) drive to the electromechanical drive. Improved performance and stability results.

17 Claims, 2 Drawing Sheets

OTHER PUBLICATIONS

Web site information, ADE Technologies, www.dms-magnetics.com "no date".

Speliotis, Dennis, "Getting the Most From Your Vibrating Sample Magnetometer," ADE Technologies, Inc., Newton MA "no date".

Application Note, "The Performance of the DMS Model 10 High Field VSM" Digital Measurement Systems Division of ADE Technologies, Inc. "no date".

Application Note, "The Importance of Low System Noise in VSM Measurements" Digital Measurement Systems Division of ADE Technologies, Inc. "no date".

Application Note, "The Impact of System Noise in Low Moment VSM Measurements" Digital Measurement Systems Division of ADE Technologies, Inc. "no date".

Foner, S., "Versatile and Sensitive Vibrating–Sample Magnetometer," *The Review of Scientific Instruments,* vol. 30, No. 7, pp. 548–557 (Jul./1959).

* cited by examiner

ELECTROMECHANICAL DRIVE FOR MAGNETOMETERS

CROSS-REFERENCES TO RELATED APPLICATIONS

Priority is claimed from provisional application number No. 60/314,434 filed Aug. 23, 2001 entitled "VOICE COIL DRIVE FOR MAGNETOMETERS," which application is incorporated herein by reference.

STATEMENT REGARDING FEDERALLY SPONSORED RESEARCH OR DEVELOPMENT

Not applicable.

FIELD OF THE INVENTION

The present invention relates to an improved apparatus and its use in a method to control sample motion in magnetometers, such as vibrating sample magnetometers, where an oscillatory sample motion is required.

BACKGROUND AND SUMMARY OF THE INVENTION

Vibrating sample magnetometers (VSM's) have become standard equipment for measuring the magnetic moment of materials. Detailed descriptions of the VSM first appeared with the pioneering work of S. Foner ("Versatile and Sensitive Vibrating-Sample Magnetometer", Review of Scientific Instruments, Vol. 30, pp. 548–557 (1959); see also U.S. Pat. Nos. 2,946,948, 3,496,459, and 4,005,358).

Conceptually, the vibrating sample magnetometer is very straightforward. The sample to be measured is vibrated in a magnetic field that is typically generated by laboratory electromagnets or superconducting solenoids. Inductive pick-up coils are mounted near the sample. These coils are an assembly of wire wound coils with varying geometries depending upon the specifics of the system and what is desired in the measurement. As the magnetized sample vibrates, a voltage is induced in the pick-up coils (Faraday's Law) that is directly related to the magnetic moment of the sample. With proper calibration, this voltage output directly yields the magnetic moment of the sample. Magnetic moment is measured in either electromagnetic units (emu) in the Centimeter-Gram-Second (cgs) system of units or in ampere-meters squared (A-m$^2$) in The International System of Units (SI).

Generally the quality of a VSM measurement depends upon the proper integration of all components of the VSM: sample drive, pick-up coils, magnetic field generation, and signal detection electronics. Since the publication of the first description of a VSM, there have been a considerable number of publications describing improvements in all aspects of the VSM. The present day VSM has evolved into a very sophisticated instrument featuring state-of-the-art detection schemes, control, and technology. This invention relates to the drive method used to vibrate and control the sample.

One of the most common sample drives used in VSM's is an alternating current (ac) driven voice coil drive, similar to what is used in a common loudspeaker. In fact, Foner's first detailed description referenced above shows a loudspeaker to which a rod and sample are attached. Since the VSM output depends directly upon the stability, control, and isolation of the sample motion, more elaborate voice coil drives have evolved through the years. These have included drives using one or more of the following: phosphor bronze springs for mechanical integrity, a means to feedback drive signal information to control the vibration amplitude, and vibration damping schemes to minimize vibration coupling to the detection coil system. Other methods have been used to vibrate the sample, such as motors with camshafts, but the voice coil drive has remained the most widely used due to its simplicity and ease of use.

Although different implementations of the mechanics surrounding the voice coil continue to be employed by users, control of the ac drive amplitude using an ac feedback signal has become standard procedure to maintain precise control of the sample oscillation. A variety of feedback schemes to monitor the sample motion have been used. In one method, a parallel plate capacitor is formed between one plate rigidly attached to the drive housing and a second plate attached to a sample rod that is rigidly connected to and supports the sample. As the sample and sample rod move, the variation in capacitance is used in a feedback loop to control the sample drive oscillation. Another feedback scheme uses a permanent magnet mounted to the sample rod well outside of the magnetic field and rigidly mounted inductive pick-up coils. As the rod vibrates, the voltage induced in the pick-up coils by the vibrating permanent magnet is used in a feedback loop to control the sample drive. Operating frequencies for the VSM voice coil drives typical fall within the range of 30 to 100 Hertz (Hz).

While much work has been done in the past, there are a number of shortcomings with existing drive technologies. For example, current mechanical assemblies used in a VSM drive can require warm-up times of several hours to achieve their specified stability. Further, such assemblies can show drifts associated with environmental changes such as temperature and humidity. Also, any non-linearities in the ac behavior of the feedback sensor or voice coil related to the positioning of the elements, whether capacitor plates, permanent magnets, voice coil components, etc., can cause variations in the VSM output.

Increasing technological demands for improved magnetic measurements are requiring improvements in all aspects of magnetometer performance. Illustrative embodiments of the present invention overcome the disadvantages noted above for existing drive technologies by providing an improved device and methodology for voice coil drives suitable for these magnetometer applications.

One aspect of an illustrative embodiment of the present invention provides an apparatus and a method for improved control of a voice coil sample drive through the use of both ac and direct current (dc) voltage control that results in better overall stability and performance for a VSM.

The apparatus of the illustrative embodiment present invention comprises a VSM sample drive which uses a feedback sensor that provides not only ac amplitude information on the sample movement, but also absolute position information. This feedback is used in proportional/integral (PI) control loops to control both a dc and an ac drive to the voice coil. The dc drive signal maintains precise positioning of the voice coil/feedback sensor arrangement while the ac drive signal provides the control required for the oscillatory sample motion.

BRIEF DESCRIPTION OF THE DRAWINGS

These and other features and advantages provided in accordance with exemplary and illustrative embodiments of the present invention may be better and more completely understood by referring to the following detailed description in conjunction with drawings, of which.

DETAILED DESCRIPTION OF PRESENTLY PREFERRED EXAMPLE EMBODIMENTS

Figure 1:
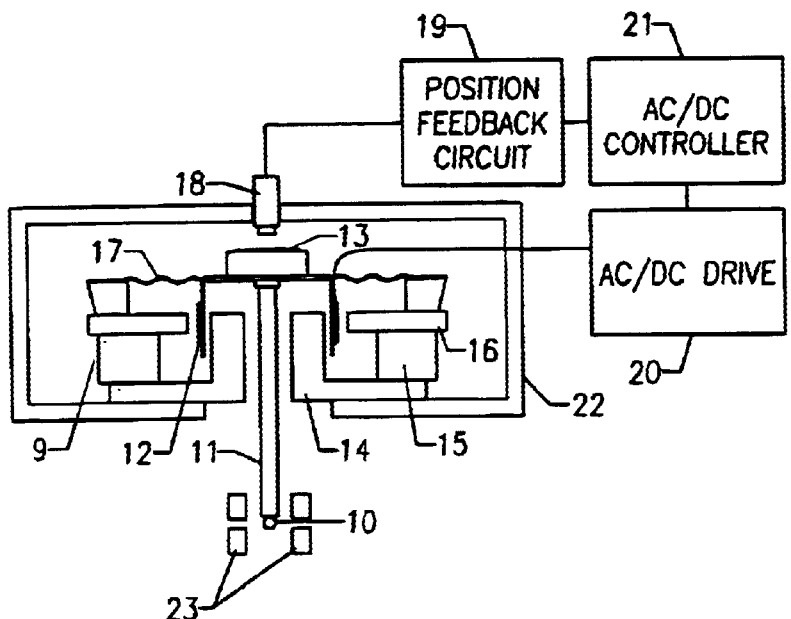
FIG. 1 is a schematic illustration of an illustrative exemplary voice coil drive apparatus with pick-up coils.

FIG. 1 schematically illustrates a preferred illustrative embodiment of the present invention comprising a voice coil drive 9 and assembly. The mechanical parts of voice coil drive 9 comprise a magnet 15, magnet pole plates 14 and 16, a flexible suspension 17, and the coil 12. In this illustrative embodiment, the voice coil 12 is suspended from the flexible suspension 17 and moves up and down in the gap between the magnet pole plates 14 and 16 when driven by an ac voltage. Voice coil drive 9 is mounted inside a rigid enclosure 22 in this example.

A sample rod 11 is rigidly attached to the voice coil coil 12 in the illustrative embodiment. The lower end of the rod 11 extends into the region of the test magnetic field (not shown). The sample 10 being measured is attached rigidly to the end of the sample rod 11. Note the assembly consisting of the coil 12, the sample rod 11, and the sample 10 are all rigidly connected and move together. The pick-up coils 23 are located in proximity to the sample 10. The other components of the VSM, magnet, power supply, pick-up coils, etc., can be conventional and obtained from a commercially available product that was standard in the art.

Conventional VSMs monitor the ac response of sample and control the ac drive to the voice coil. The preferred example illustrative embodiment of this invention uses a position sensor 18 that can be used to monitor the absolute displacement between the sensor and the vibrating assembly—not just the ac response. The sensor 18 chosen for this work was a commercially available eddy current position sensor. Although other sensors, such as a laser displacement sensor, could be used, the eddy current sensor was chosen for its size and ease of integration into the mechanical assembly. The eddy current position sensor 18 measures displacement by generating and detecting eddy currents in a target surface 13. To optimize performance, the target 13 is preferably specified to be a specific material to be placed a given distance from the sensor 18. The sensor 18 is provided, in the illustrative embodiment, with an electronic module that outputs a voltage that varies with distance between the sensor and target. Thus, when the target 13 is stationary and the displacement is fixed, the output is simply a dc voltage. If the target 13 is oscillating about a fixed position, the output will be an ac voltage proportional to the oscillation amplitude plus a dc voltage proportional to the mean displacement from the sensor 18. Note that this is a non-contact measurement in the example embodiment.

For purposes of illustrations as shown in FIG. 1, the eddy current sensor 18 may be mounted on top of the enclosure 22. The eddy current sensor target 13 is rigidly mounted to the top of the voice coil coil 12, so the target moves synchronously with the coil and sample. The output voltage from the eddy current sensor is used in a feedback circuit to control the drive to the voice coil. In the illustrative embodiment, the eddy current sensor voltage is first separated into its dc and ac components in a position feedback circuit 19. An AC/DC Controller 21 in the illustrative embodiment comprises two independent PI control loops, one for the ac voltage and one for the dc voltage. The desired control voltage for each loop could be set independently. The PI controllers then control the AC/DC Drive source 20. The drive source 20 generates a summed dc and ac current to drive the coil 12 to maintain constant ac and dc voltage outputs from the eddy current sensor.

While FIG. 1 is a preferred combination of drive components and assemblies, it will be apparent to one skilled in the art that various substitutions of components or control algorithms may be made.

The apparatus of the preferred example embodiment of the present invention provides several functional features. First, the ac voltage control maintains constant ac vibration amplitude. This is desirable for a good VSM measurement and is common practice. Second, the dc voltage control maintains the relative position of the coil with respect to the sensor 18 constant and also maintains the coil position with respect to the magnet pole plates 14 and 16 constant. This dc means of control provides for increased VSM stability as shown below.

There are several sources of instability that can be minimized with this method of control. In an uncontrolled system, variations in the relative position of the components used in the motion feedback scheme can result from temperature or other environmental changes, resulting in signal drifts and changes in sensitivity of the VSM. For example, in the voice coil drive shown in FIG. 1, differential thermal expansion of the physical components can cause a shift in the relative position of the eddy current sensor 18 and target 13. If the feedback system detecting the motion is non-linear in its ac sensitivity with respect to these position changes, a shift in the sample oscillation amplitude will occur which is directly translated into a shift in the VSM output. Also, by maintaining the exact position of the voice coil coil 12 with respect to the magnet pole plates 14 and 16, further consistency of motion is guaranteed.

Figure 2:
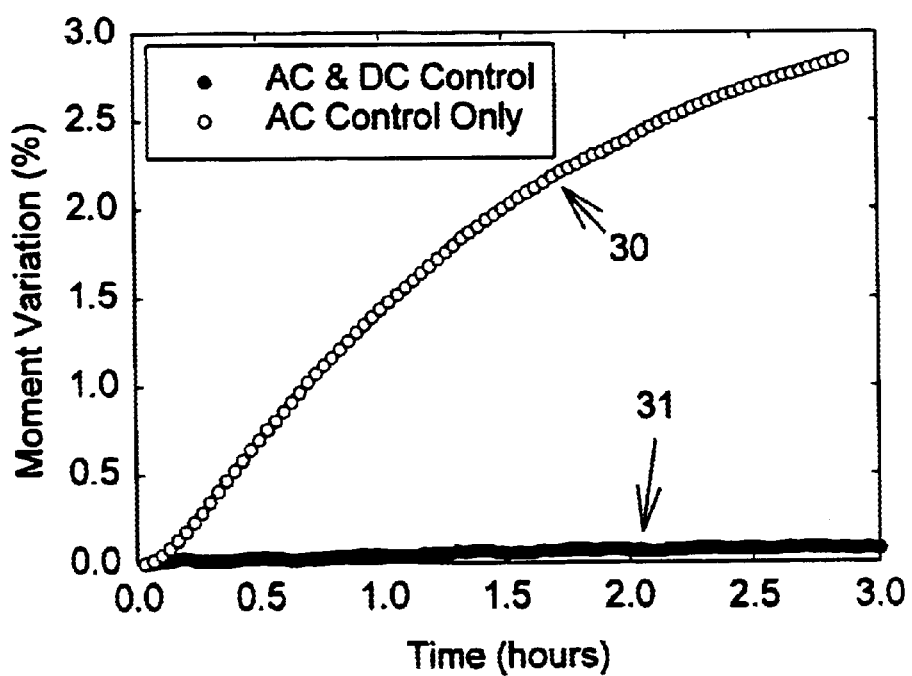
FIG. 2 shows the moment variation observed during the initial start-up of the illustrative exemplary VSM when the sample drive is under ac control only or under both ac and dc control.

FIG. 2 shows the benefits of the illustrative embodiments of this invention with respect to the drifts associated with initial warm-up after the drive has been off for an extended period of time and allowed to reach ambient temperature. The x-axis shows illustrative elapsed time after turning the head on, while the y-axis shows illustrative percent variation recorded for the moment of a saturated nickel standard sphere. Curve 30 shows an illustrative variation when only ac feedback and control is used. Similar behavior has been observed in commercially available heads using voice coil drives. Curve 31 shows the same measurement except that both ac and dc feedback and control is used. After three hours, having ac only control showed nearly a 3% moment variation upon warm-up, whereas having ac and dc control showed a significantly reduced warm-up of only 0.08%. During the test, variations in room temperature could possibly have accounted for 0.05% of the total variation observed in the data of curve 31.

Figure 3:
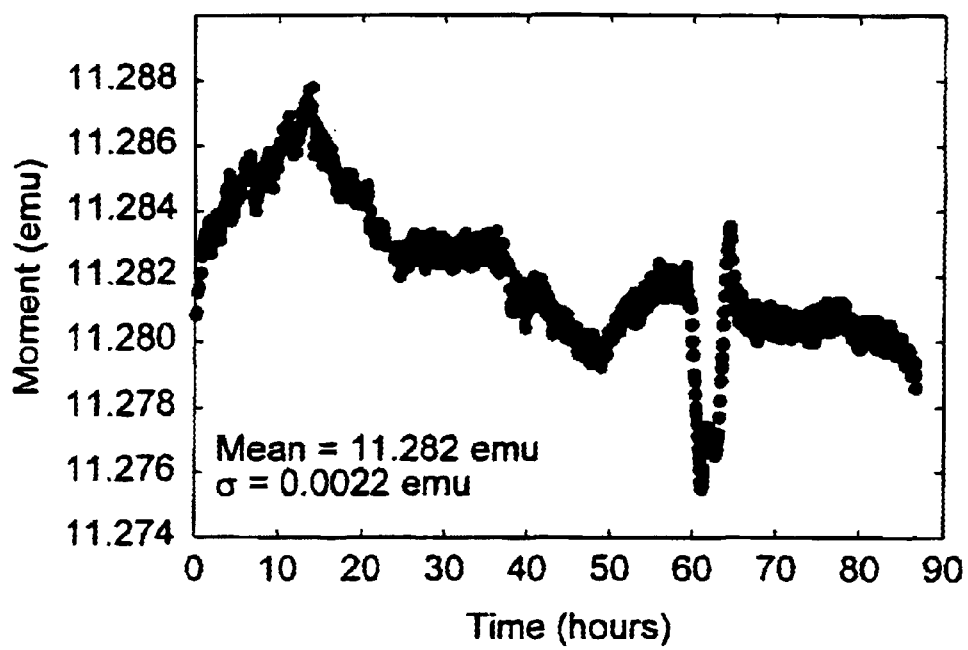
FIG. 3 shows an illustrative moment variation recorded on an Aluminum/Nickel/Cobalt (alnico) alloy permanent magnet over a 90 hour time period when the head drive utilized both ac and dc control.

To demonstrate the long-term stability that can be achieved with control of both the ac and dc voltage, FIG. 3 shows illustrative moment data recorded on an alnico permanent magnet over nearly 90 hours of continuous measurements. The x-axis gives illustrative elapsed time, while the y-axis shows illustrative moment recorded for the alnico sample. The peak-to-peak variation over the total 90-hour time period was only 0.11% of the mean value, with the standard deviation of the data at only 0.02% of the mean. Although stability specifications for commercial products are not always clear or available, typical reported values for stability is expected to be in the range of 0.05%/hr to 0.1%/hr for a moment of this size. The results shown here over a 90-hour period are significantly improved as compared to conventional results.

Figure 4:
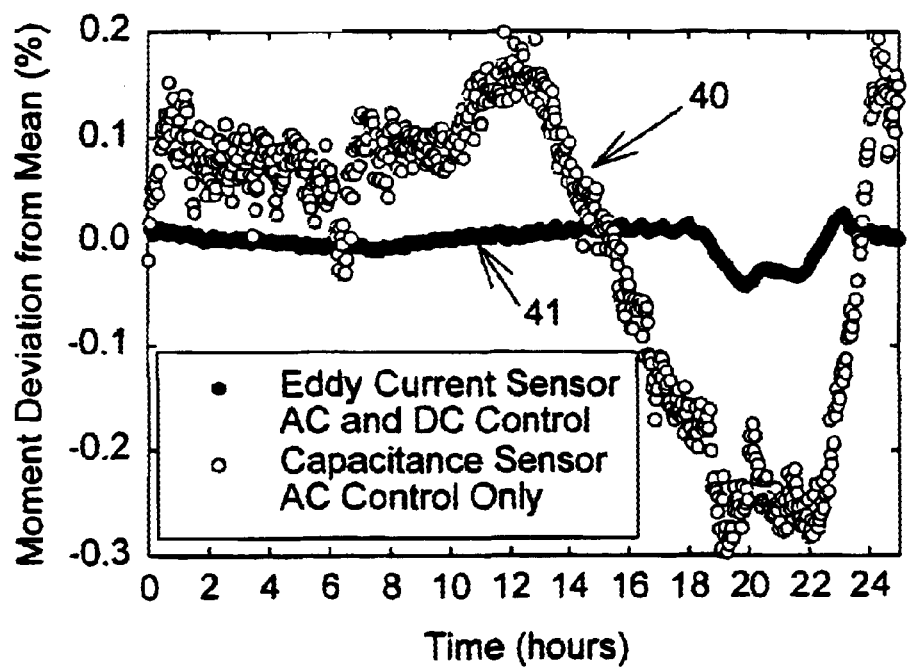
FIG. 4 shows illustrative moment variation expressed as a percent of the mean value for two different VSMs operating in the same environment over the same time periods (one using a head drive with both ac and dc control while the second uses a head drive utilizing a capacitance feedback sensor with ac feedback only).

In another stability comparison, FIG. 4 compares the moment variation from the mean value for an alnico permanent magnet for two different voice coil drives over the same 24 hour period operating in the same environment. The x-axis gives illustrative time elapsed from the start of the time period, while the y-axis gives illustrative percent variation of the moment. Curve 40 is a commercially available voice coil drive based on using capacitor plates as the motion feedback sensor where only ac control is done. The observed stability meets the manufacturers specifications. Curve 41 is illustrative variation recorded using both ac and dc feedback and control with the voice coil drive of the present invention illustrated in FIG. 1. There is a factor of 10 improvement in the overall stability.

Sensitivity to humidity variations has been observed in VSMs with voice coil drives. The magnitude of the effect appears to be related to the actual humidity level. Tests were run with the relative humidity varying from 45% to 65%. When ac feedback and control only was used in the voice coil drive, the moment showed a sensitivity of 0.24%/% relative humidity. When dc feedback and control was added, this sensitivity decreased to about 0.01%/% relative humidity. Again, considerable improvements in stability are achieved through the use of both ac and dc control of the voice coil drive.

Another benefit to the addition of dc control of the voice coil drive relates to minimizing moment variations when the sample 10 or sample rod 11 in FIG. 1 varies in mass. A change in mass changes the loading on the flexible suspension 17, which in turn alters the positioning of the target 13 with respect to the sensor 18. The additional mass also changes the response of the vibrating assembly to the drive signal. With no dc control, a moment variation of 1.19% was observed with a 9.3 gram change in sample rod mass. With dc control, a moment variation of only 0.17% was observed with the same mass change. The benefits noted here would apply to any position or motion sensor that has sensitivity variations with absolute position.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the scope of the claims.

What is claimed is:

1. In a magnetometer, a controller for in use, controlling an electromechanical drive used to generate oscillating sample motion, said electromechanical drive being coupled to move a vibrating or oscillating assembly, said controller providing ac and dc drive signals to actuate said electromechanical drive, said electromechanical drive imparting motion to said vibrating or oscillating assembly in response to said ac and dc drive signals, said controller including:

a position sensor that monitors the position of at least a portion of said assembly, said position sensor providing information on the relative position of the vibrating or oscillating assembly; and an electronic measuring arrangement that is responsive to the output from the position sensor in a control feedback loop, said electronic measuring arrangement controlling both the ac and dc drive signals to the electromechanical drive to maintain substantially constant output from the position sensor.

2. The controller of claim 1 wherein said electromechanical drive comprises a voice coil drive.

3. The controller of claim 1 wherein said position sensor comprises an eddy current sensor.

4. The controller of claim 1 wherein said position sensor measures absolute displacement between said vibrating or oscillating assembly and said position sensor.

5. The controller of claim 1 wherein said electronic measuring arrangement includes a position feedback circuit including independent ac and dc control loops.

6. The controller of claim 1 wherein said electronic measuring arrangement includes a drive source that generates a summed dc and ac current to drive the electromechanical drive and maintain substantially constant ac and dc voltage outputs from said position sensor.

7. The controller of claim 1 further wherein said electromechanical drive includes an electromechanical driving transducer including at least one magnet, at least one magnetic pole plate, a flexible suspension and a coil.

8. The controller of claim 1 wherein said sample comprises a sample with a magnetic moment and said vibrating or oscillating assembly includes a sample rod for retaining said sample.

9. The controller of claim 1 further including a sensor target cooperating with said position sensor, said position sensor outputting a dc voltage but substantially no ac voltage when the target is stationary relative to the sensor and the relative displacement between the sensor and the target is fixed, said position sensor outputting an ac voltage proportional to an oscillation amplitude when the target is oscillating about a fixed position relative to said position sensor.

10. The controller of claim 1 wherein said position sensor uses a non-contact sensing technique.

11. The controller of claim 1 wherein the electronic measuring arrangement separates ac and dc components outputted from said position sensor.

12. The controller of claim 1 wherein said electronic measuring arrangement maintains substantially constant ac vibration amplitude.

13. The controller of claim 1 wherein said electronic measuring arrangement provides dc voltage control that maintains relative position of said vibrating or oscillating assembly with respect to said position sensor substantially constant and also maintains said vibrating or oscillating assembly position with respect to at least one magnet pull plate constant.

14. A method of measuring magnetic moment comprising:

vibrating or oscillating a sample;

measuring absolute position of a target mechanically coupled to said sample using a position sensor;

resolving an output of said position sensor into an ac component and a dc component;

using independent ac and dc feedback loops responsive to said ac and dc components, respectively, to control the vibration or oscillation of said sample; and measuring a voltage induced in a pick-up coil in proximity to said sample in order to determine the magnetic moment of the sample.

15. The method as in claim 14 wherein said vibrating or oscillating step is performed using a voice coil.

16. The method as in claim 14 wherein said position sensor comprises an eddy current position sensor that measures displacement by generating and detecting eddy currents in said target.

17. The method as in claim 14 further comprising generating a summed dc and ac current to drive an electromechanical assembly mechanically coupled to said sample in order to maintain substantially constant ac and dc voltage outputs from said position sensor.

* * * * *